(12) United States Patent
Jiang et al.

(10) Patent No.: US 7,358,185 B2
(45) Date of Patent: Apr. 15, 2008

(54) DEVICE HAVING CONTACT PAD WITH A CONDUCTIVE LAYER AND A CONDUCTIVE PASSIVATION LAYER

(75) Inventors: Tongbi Jiang, Boise, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 11/234,000

(22) Filed: Sep. 23, 2005

(65) Prior Publication Data

US 2006/0017163 A1 Jan. 26, 2006

Related U.S. Application Data

(63) Continuation of application No. 10/634,134, filed on Aug. 4, 2003, now Pat. No. 6,967,164, which is a continuation of application No. 09/854,292, filed on May 9, 2001, now Pat. No. 6,630,400, which is a continuation of application No. 09/256,548, filed on Feb. 24, 1999, now Pat. No. 6,303,500.

(51) Int. Cl.
*H01L 21/60* (2006.01)
(52) U.S. Cl. .................. 438/674; 438/677; 438/678; 438/778; 205/201; 205/205
(58) Field of Classification Search ................ 438/674, 438/677, 678, 778, FOR. 388, FOR. 390; 205/201, 203, 205, 212, 213, 219, 221
See application file for complete search history.

(56) References Cited

U.S. PATENT DOCUMENTS 781,230 A 1/1905 Rodman
2,935,420 A 5/1960 Linden (Continued)

OTHER PUBLICATIONS

Baudrand, D., et al., *Electroless Plating Processes—Developing Technologies for Electroless Nickel, Palladium, and Gold*, Metal Finishing, Sep. 1995, pp. 55-57.

(Continued)

*Primary Examiner*—George Fourson
*Assistant Examiner*—Joannie Adelle Garcia
(74) *Attorney, Agent, or Firm*—Knobbe Martens Olson & Bear LLP

(57) ABSTRACT

A method and apparatus is disclosed for sequential processing of integrated circuits, particularly for conductively passivating a contact pad with a material which resists formation of resistive oxides. In particular, a tank is divided into three compartments, each holding a different solution: a lower compartment and two upper compartments divided by a barrier, which extends across and partway down the tank. The solutions have different densities and therefore separate into different layers. In the illustrated embodiment, integrated circuits with patterned contact pads are passed through one of the upper compartments, in which oxide is removed from the contact pads. Continuing downward into the lower compartment and laterally beneath the barrier, a protective layer is selectively formed on the insulating layer surrounding the contact pads. As the integrated circuits are moved upwardly into the second upper compartment, a conducting monomer selectively forms on the contact pads prior to any exposure to air. The integrated circuits can then be transferred to an ozone chamber where polymerization results in a conductive passivation layer on the contact pad.

9 Claims, 2 Drawing Sheets

U.S. PATENT DOCUMENTS

| | | | |
|---|---|---|---|
| 3,339,526 A | 9/1967 | Bradley et al. | |
| 3,839,037 A | 10/1974 | Fromson | |
| 3,923,541 A | 12/1975 | Healy | |
| 3,930,465 A | 1/1976 | Schuierer | |
| 3,990,926 A | 11/1976 | Konicek | |
| 4,113,899 A | 9/1978 | Henry et al. | |
| 4,282,271 A | 8/1981 | Feldstein | |
| 4,364,975 A | 12/1982 | Cork et al. | |
| 4,474,311 A | 10/1984 | Petrecca | |
| 4,603,656 A | 8/1986 | Jaye, Jr. | |
| 4,749,621 A * | 6/1988 | Araps et al. | 428/473.5 |
| 4,762,601 A | 8/1988 | Krulik et al. | |
| 4,772,496 A | 9/1988 | Maeda et al. | |
| 4,913,082 A | 4/1990 | Silbermann et al. | |
| 4,938,850 A | 7/1990 | Rothschild et al. | |
| 5,028,454 A | 7/1991 | Lytle et al. | |
| 5,118,362 A | 6/1992 | St. Angelo et al. | |
| 5,194,313 A | 3/1993 | Hupe et al. | |
| 5,206,052 A | 4/1993 | Nakaso et al. | |
| 5,262,041 A | 11/1993 | Gulla | |
| 5,342,501 A | 8/1994 | Okabayashi | |
| 5,441,629 A | 8/1995 | Kosaki | |
| 5,456,819 A | 10/1995 | Lashmore et al. | |
| 5,492,863 A | 2/1996 | Higgins, III | |
| 5,500,106 A | 3/1996 | Goldberg | |
| 5,512,131 A | 4/1996 | Kumar et al. | |
| 5,583,073 A | 12/1996 | Lin et al. | |
| 5,603,849 A | 2/1997 | Li | |
| 5,618,634 A | 4/1997 | Hosoda et al. | |
| 5,725,807 A | 3/1998 | Thorn et al. | |
| 5,810,940 A | 9/1998 | Fukazawa et al. | |
| 5,821,264 A * | 10/1998 | Lane et al. | 514/458 |
| 5,897,332 A * | 4/1999 | Hori et al. | 438/61 |
| 5,897,368 A | 4/1999 | Cole, Jr. et al. | |
| 5,911,865 A | 6/1999 | Yih | |
| 5,925,931 A | 7/1999 | Yamamoto | |
| 6,010,966 A * | 1/2000 | Ionov | 438/706 |
| 6,239,355 B1 * | 5/2001 | Salafsky | 136/250 |
| 6,303,500 B1 * | 10/2001 | Jiang et al. | 438/678 |
| 6,849,869 B1 * | 2/2005 | O'Regan et al. | 257/40 |
| 2001/0013657 A1 * | 8/2001 | Anand | 257/758 |

OTHER PUBLICATIONS

Hawk, W.J., *Electroless Palladium for Electronics, Metal Finishing*, Mar. 1986, pp. 11-12.

Lim, J.K., et al., *Electroplated Palladium Coating as a Nickel Migration (Thermal) Barrier, Plating and Surface Finishing*, Mar. 1996, pp. 64-67.

Nawafune, H., et al., *Electroless Palladium Plating from an Ethylenediamine Complex Bath Using Phosphite as a Reducing Agent, Transactions of the Institute of Metal Finishing*, vol. 74, No. 1, pp. 21-24.

Rao, *Multilevel Interconnect Technology*, Chapter: Manufacturing, p. 141.

Steinmetz, P., et al., *Electroless Deposition of Pure Nickel, Palladium and Platinum, Surface Coatings Technology*, 43/44, 1990, pp. 500-510.

* cited by examiner

DEVICE HAVING CONTACT PAD WITH A CONDUCTIVE LAYER AND A CONDUCTIVE PASSIVATION LAYER

REFERENCE TO RELATED APPLICATIONS

This application is a continuation of U.S. patent application Ser. No. 10/634,134, filed Aug. 4, 2003, now U.S. Pat. No. 6,967,164 which is a continuation of U.S. patent application Ser. No. 09/854,292, filed May 9, 2001, issued as U.S. Pat. No. 6,630,400, which is a continuation of U.S. patent application Ser. No. 09/256,548, filed Feb. 24, 1999, issued as U.S. Pat. No. 6,303,500. Each of these applications is incorporated in its entirety by reference herein.

FIELD OF THE INVENTION

The invention relates generally to contact pads in integrated circuits, and more particularly to oxide-free bond pads.

BACKGROUND OF THE INVENTION

Bond pads are electrical terminals which connect an integrated circuit die or chip to the electrical system outside of the chip. The electrical connection is normally made by bonding electrical leads to the bond pad. The chip can then be connected to a larger circuit, such as a printed circuit board (PCB), with the leads making contact with the outside system.

The bond pads are integrally connected to metal lines or runners within the die, which are typically formed of a metal such as aluminum, aluminum-silicon eutectic, aluminum-copper alloys, or polysilicon. The bond pads themselves are also typically formed of aluminum or an aluminum alloy, which is highly conductive and relatively inexpensive. Unfortunately, aluminum or aluminum alloy readily oxidizes to form aluminum oxide. The aluminum oxide is not conductive, and it therefore increases the overall resistivity of the system. Increased resistivity, in turn, leads to slower signal propagation.

Conventionally, aluminum oxide is removed with a reducing agent in several separate steps. The chip is exposed to atmosphere between steps, and the exposed metal spontaneously oxidizes, impairing the conductive connection. Even the short exposure between oxide cleaning and sealing the bond pad results in aluminum oxide formation between the metal and sealant.

There is thus a need for a method of avoiding oxide on the surface of a contact pad.

SUMMARY OF THE INVENTION

In view of this need, the present invention provides a method and apparatus for providing conductive passivation on contact pads, such as bond pads.

In accordance with one aspect of the invention, a method is provided for plating a conductive layer in an integrated circuit. The method includes immersing the integrated circuit in a cleaning fluid. The integrated circuit is then transferred from the cleaning fluid to a plating fluid, without exposing the integrated circuit to air.

In an illustrative embodiment, such transfer is performed directly from one liquid phase to another. The cleaning fluid represents a first liquid phase, preferably an oxide etch bath, and the second liquid phase forms a protective layer over the insulating material which surrounds the contact pad. The plating fluid is in yet a third liquid phase, containing a conducting monomer in solution. This forms a monomer layer over the conductive layer, which is later polymerized to form a conductive polymer. The integrated circuit sequentially moves between the first and second phases, and between the second and third phases, without passing through air. As will be understood by the skilled artisan, such an arrangement enables sealing the underlying conductive layer of the contact pad, which may be susceptible to oxidation, immediately after oxide removal. Nether oxide nor other contaminants have the opportunity to form on the conductive layer between steps, which would hinder electrical contact between the contact pad and outside circuits.

In accordance with another aspect of the invention, an apparatus is provided for sequential processing with two or more liquid solutions. The apparatus includes a water-tight tank with an upper portion and a lower portion. The upper portion is divided into at least a first side and a second side by a water-tight barrier. The lower portion is open to and extends beneath both the first side and the second side.

This apparatus is particularly useful for the illustrated process, where one side of the upper portion holds an oxide cleaning agent (e.g., 1% NaOH, density about 1.0 g/cm$^3$) and the other side of the upper portion holds a conducting monomer in solution (e.g., pyrrole, density less than about 0.99 g/cm$^3$). The barrier separates the cleaning solution from the monomer solution. The lower portion holds a relatively more dense solution for forming a protective layer (e.g., siliconizing solution, density about 1.09 g/cm$^3$), ensuring that the phases are naturally separated by gravity.

DETAILED DESCRIPTION OF THE PREFERRED EMBODIMENT

The present application describes a method of cleaning and passivating a conductive surface with a conductive layer without exposing the surface to air between the process steps. While illustrated in the context of conductive passivation of aluminum bond pads, the skilled artisan will recognize many other applications for the methods and structures disclosed herein. In particular, contact pads formed of other metals, while less susceptible to oxidation, will also benefit from the conductive passivation of the illustrated embodiment. Furthermore, sequential cleaning and conductive passivation, without allowing re-oxidation, will have utility for a great many applications beyond integrated bond pads.

Initially, an integrated circuit is formed on a substrate. The substrate includes a semiconductor layer or wafer, such as silicon or gallium arsenide, in which active or operable portions of electrical devices are formed. Through a series of mask, etch and deposition steps, electrical devices such as transistors, capacitors and resistors are integrally formed and interconnected by metal layers separated by insulating layers. Typically, a plurality of chips or dies are formed in a single wafer.

Upper levels of the metal interconnections are terminated in integral bond pads for forming connections between the chips or dies and outside circuits. The bond pads comprise conductive layers surrounded by insulating layers. Similar contact pads, typically referred to as "probe pads," are often formed in lower layers for testing circuits at intermediate steps in fabrication.

The conductive layers can be metal, silicide, or other suitable conductive material. Some examples of conductive layers include, but are not limited to, copper, gold, aluminum, doped silicon and the like. Mixtures of metals are also suitable for forming a conducting layer. Some suitable mixtures of metals include, but are not limited to, aluminum alloys formed with copper and/or silicon.

Figure 1:
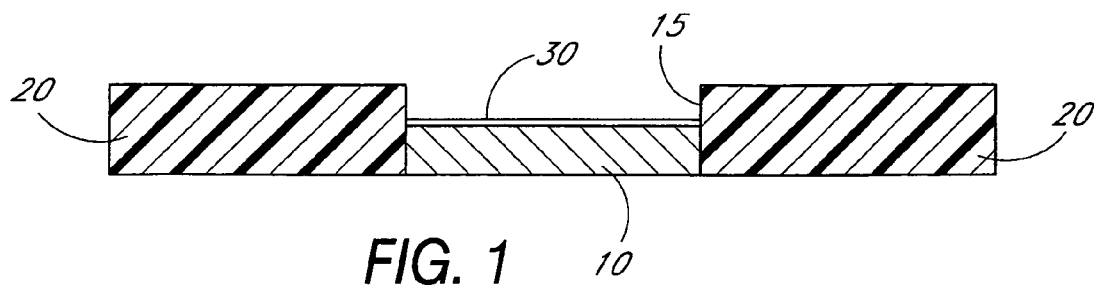
FIG. 1 is a partial cross-sectional view of partially fabricated integrated circuit, showing a bond pad covered with an oxide layer.

FIG. 1 illustrates such a conductive layer 10 formed and patterned into a bond pad over metal layers and devices formed in a substrate (not shown). A window 15 is formed in a surrounding insulating layer 20 to expose the conductive layer 10. The illustrated insulating layer 20 is a dielectric material suitable for final passivation, such as silicon dioxide, silicon nitride or silicon oxynitride. In the illustrated embodiment, the insulating layer comprises silicon nitride ($Si_3N_4$), which is known to have good moisture barrier qualities.

The conductive layer 10 of the illustrated embodiment comprises aluminum, and particularly aluminum mixed with copper. In a preferred embodiment, the conductive layer comprises aluminum with about 0.5% copper content. The illustrated conductive layer 10 is particularly susceptible to oxidation. An oxide layer 30 thus naturally forms on the surface of the conductive layer 10, as shown in FIG. 1, upon exposure to air, such as after deposition of the conductive layer 10. The illustrated oxide layer 30 comprises aluminum oxide, which prevents or hinders electrical conduction from the conductive layer 10 to contacts formed thereupon, such as wire bonds or solder balls. It is therefore preferred to remove the oxide layer 10 before attaching a conductive contact (e.g., pins, wires, solder balls, etc.) to the bond pad.

Traditionally, removal of the oxide layer 30 and formation of a contact comprise several process steps, and even brief exposure to air between steps results in re-oxidation and/or other contamination of the conductive layer 10. For the illustrated conductive layer 10, oxidation of the aluminum in the presence of air is almost instantaneous. The embodiments of the present invention provide a method of removing the oxide layer 30 and passivating the exposed conductive layer 10 with a conductive polymer in situ, without exposing the conductive layer 10 to air or other contaminants.

The oxide layer 30 can be removed in a variety of ways. Typically, the oxide layer 30 is exposed to a reducing agent. In the illustrated embodiment, the substrate is immersed in a dilute base solution (e.g., between about 8 pH and 14 pH). An exemplary solution for removing the oxide layer comprises approximately 1% NaOH in water. The bath is preferably between about 20° C. and 50° C., more preferably between about 20° C. and 30° C. The wafer is preferably immersed in the solution for between about 0.2 and 30 minutes, more preferably between about 1 and 10 minutes.

Figure 2:
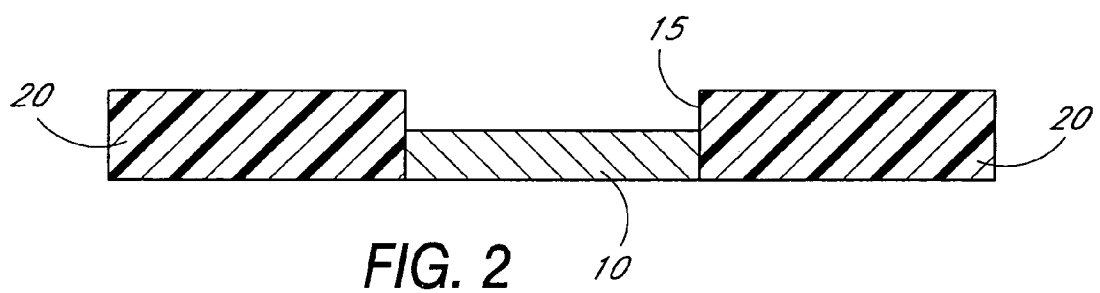
FIG. 2 illustrates the integrated circuit of FIG. 1 after the oxide layer has been removed, exposing the conductive layer.

FIG. 2 shows the integrated circuit after removal of the metal oxide 30 from the top of the conductive layer 10. Removal of the metal oxide 30 exposes the conductive layer 10, as shown. If exposed to air, the metal in the conductive layer 10 would spontaneously re-oxidize, forming a new metal oxide layer. In accordance with the preferred method, however, the conductive layer 10 is not exposed to air or other contaminants after removal of the oxide 30, as will be apparent from FIG. 6 and the accompanying text.

Figure 3:
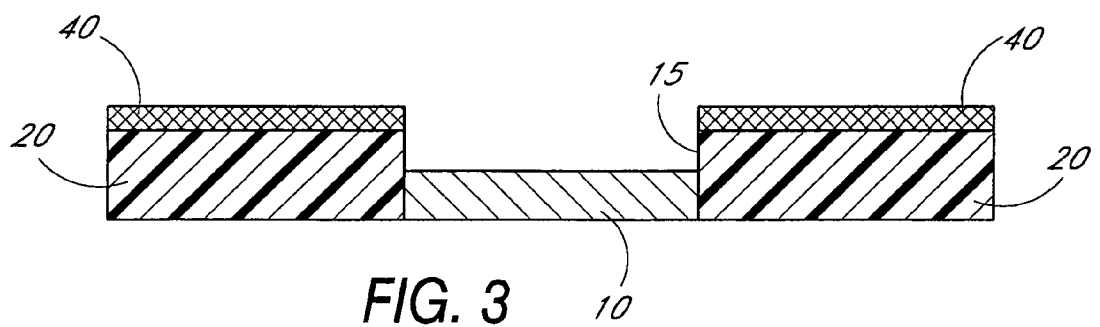
FIG. 3 illustrates the integrated circuit of FIG. 2 after a protective layer has been formed on the dielectric layer.

With reference to FIG. 3, a protective layer 40 is then formed on the insulating layer 20. The protective layer 40 is selectively formed on the insulating layer 20 without forming on the exposed conductive layer 10. In the illustrated embodiment, such selectivity is accomplished by immersing the integrated circuit in a siliconizing agent. The siliconizing agent can comprise a wide variety of compounds. An exemplary siliconizing agent is dichloro-octamethyl-tetrasiloxane, commercially available from SurfaSil™ of Rockville, Ill.

Chlorine ions in the preferred siliconizing agent are attracted to silanol groups on the surface of the preferred silicon nitride insulating layer 20, essentially forming a monolayer of the siliconizing agent. The siliconizing agent, however, does not bond to the metal in the conductive layer 10. The siliconizing agent also has the advantage of continuing to clean the surface of the conductive layer 10. Moreover, exposed methyl tails of the illustrated protective layer 10 are hydrophobic, which facilitates later selective formation of the conductive passivation, as will be understood better from the discussion below.

Figure 4:
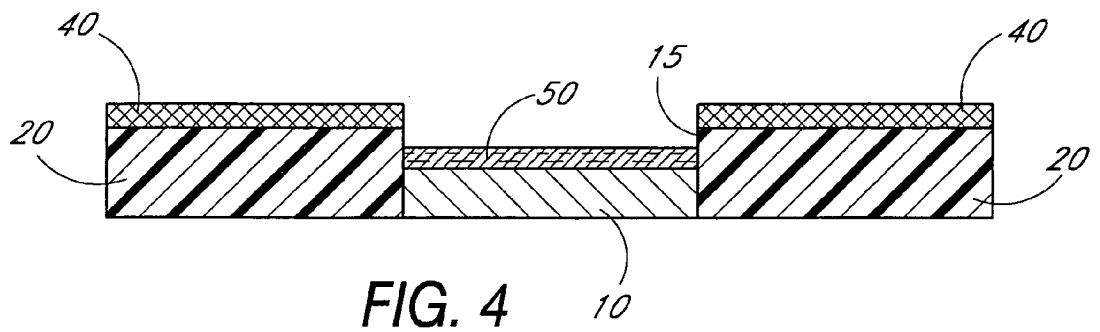
FIG. 4 illustrates the integrated circuit of FIG. 3 after formation of a passivation precursor on the conductive layer.

With reference to FIG. 4, a passivation precursor layer 50 is then deposited onto the exposed surface of the conductive layer 10. The illustrated precursor layer 50 comprises a conducting monomer, and particularly pyrrole ($C_4H_5N$), though other monomers such as acetylene or aniline can also be used. The pyrrole does not deposit onto the surface of the dielectric layer 20 due to the intervening protective layer 40. In particular, the hydrophobic upper surface of the protective layer 40 prevents pyrrole from depositing on the nitride 20, while hydrophilic interactions cause deposition on the conductive layer 10.

Figure 5:
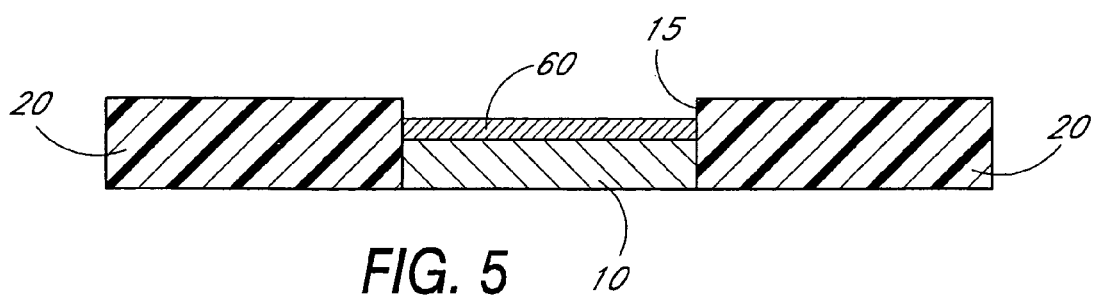
FIG. 5 illustrates the integrated circuit of FIG. 4 after treatment of the precursor layer, forming a conductive passivation layer on the conductive layer.

With reference to FIG. 5, the precursor layer 50 is then treated to result in a conductive passivation layer 60 directly on the surface of the conductive layer 10, with no intervening oxide. In the illustrated embodiment, such treatment comprises polymerizing the monomer of the preferred precursor layer 50, leaving a conductive polymer in its place. As will be readily appreciated by the skilled artisan, polymerization of the preferred precursor can be accomplished by exposure to an oxidation agent, such as ozone or permanganate.

As also shown in FIG. 5, the protective layer 40 can be removed at this point. The illustrated protective layer 40 can be removed by application of heat, which evaporates the monolayer on the surface of the insulating layer 20. The flash point for evaporation of dichloro-octamethyl-tetrasiloxane is about 78° F.

The resulting polymer 60 is non-oxidizing and therefore passivates the surface of the conductive layer 10, completing the electroless bond pad plating. At the same time, the conductive polymer 60 serves to provide a conductive surface to which wires, pins or solder balls can be attached prior to die encapsulation. The bond pad can be thereby electrically connected to outside circuitry, such as the motherboard of a personal computer.

Figure 6:
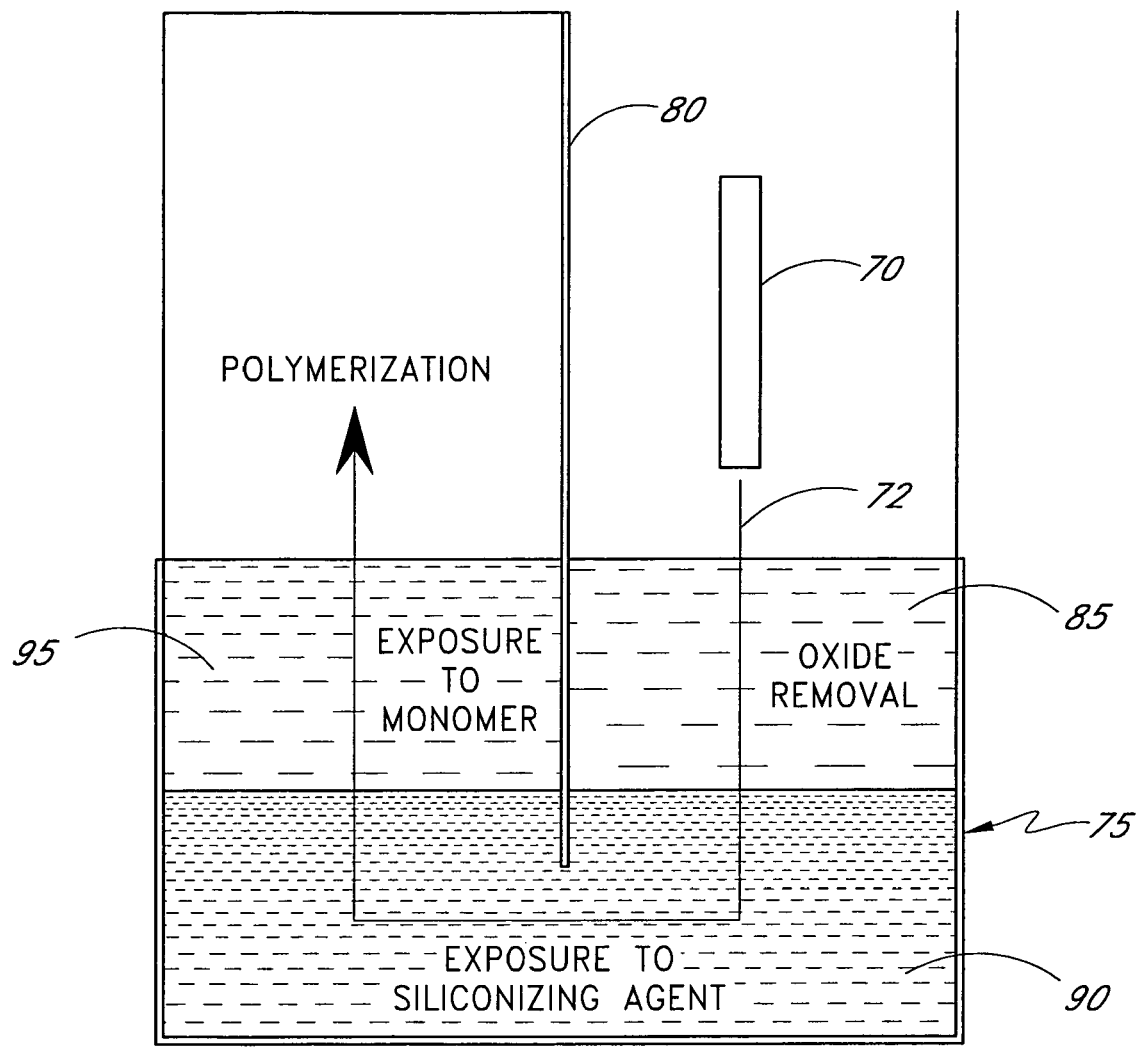
FIG. 6 is a process flow diagram showing the process steps and movement of the integrated circuit while forming the conductive passivation on the bond pad.

FIG. 6 schematically illustrates a preferred process and apparatus for forming conductive passivation for integrated contact pads. For simplicity, reference numeral 70 will be utilized to refer to an integrated circuit in which the contact pad is integrally formed. The described process begins after the integrated circuit 70 has been fabricated to the point of having windows opened in an insulating layer to expose an underlying conductive layer. The conductive layer has preferably already been patterned into a contact pad, as shown and discussed with respect to FIG. 1, though such patterning may also be conducted after forming the conductive passivation of the present invention. As also discussed above, the illustrated conductive layer 10 includes metal, particularly aluminum, and has a resistive oxide 30 formed thereover.

It will be understood that the integrated circuit 70 may be an individual die, or it may represent a wafer with a plurality of dies prior to separation. In either case, the process is most efficiently performed simultaneously on a plurality of dies or wafers in a boat or other carrier.

Both the process flow and the physical movement of the integrated circuit are illustrated in FIG. 6 by a path 72. The integrated circuit 70 is lowered into a water-tight tank or container 75, which holds a plurality of treatment phases. The container 75 is preferably formed of a robust material which can withstand the chemicals in each of the treatment phases, and is preferably made of or lined with Teflon™. Movement through the phases is preferably accomplished by known robotic mechanisms.

A water-tight barrier 80 divides the container 75 into at least two compartments, and preferably greater than two, each holding a different treatment phase. Preferably, the phases are liquid solutions which are immiscible, differ in density, and are arranged for sequential processing of the integrated circuit 70. Immiscible solutions, as that term is employed herein, refers to solutions which do not dissolve in one another. Aqueous solutions, for example, tend to be immiscible with solutions having organic solvents, although many other solutions are also immiscible. It will be apparent to the skilled artisan, in view of the present disclosure, that immiscible gaseous phases of differing densities, devoid of intermediate contaminating media, can also be arranged.

In the illustrated embodiment, the container 75 and barrier 80 define three compartments. A first compartment 85, in the upper portion of the container on a first side of the barrier 80, holds a cleaning agent for cleaning the surface of the contact pad. A second compartment 90, below the first compartment 85 and extending below the barrier 80, holds a solution for selectively forming a protective layer over the insulating layer surrounding the contact pad. A third compartment 95, extending above the second compartment on a second side of the barrier 80, holds a third solution for selectively forming a precursor layer on the contact pad. Desirably, the third compartment leads to a chamber in which the precursor layer can be treated to form the conductive passivation for the contact pad.

It will be understood that, in other arrangements, the protective layer may be unnecessary. For example, some precursor materials or final conductive passivation materials can be formed on the contact pad selectively without forming on the surrounding insulating material. Furthermore, a precursor layer need not be employed where the conductive passivation material can be formed directly, without curing or polymerizing treatments.

Returning to the illustrated embodiment, the preferred cleaning agent in the first compartment 85 comprises an oxide etchant to clean the metal oxide from the conductive layer and expose the underlying conductive layer. In other arrangements, the cleaning agent may remove other contaminants, such as carbon or sulfur. As discussed above, aluminum oxide is preferably removed by a reducing agent, and in the preferred embodiment the first compartment 85 holds a dilute base solution such as 1% aqueous NaOH, which has a density of about 1.0 g/cm. The integrated circuit 70 is lowered into first compartment 85, cleaning the oxide from the surface of the conductive layer. It will be understood that the term "lowered" is meant in encompass movement of the container 75 relative to a stationary integrated circuit 70.

The integrated circuit 70 is further lowered to the second compartment 90, where the second solution selectively forms a protective layer on the insulating material surrounding the contact pad. In the preferred embodiment, the surrounding insulating material comprises silicon nitride, and the second solution comprises a siliconizing agent. The preferred siliconizing agent forms the protective layer with a hydrophobic upper surface, while continuing to clean the metal of the contact pad.

The preferred solution (dichloro-octamethyl-tetrasiloxane, commercially available under from SurfaSil™ of Rockville, Ill.) is an organic solution having a density of about 1.09 g/cm$^3$. The second solution does not mix with the overlying aqueous NaOH in the first compartment 85, and naturally rests below the aqueous NaOH, and no physical barrier or intermediate chamber is required to separate the phases. The integrated circuit 70 thus passes from a first phase in the first compartment 85 to a second phase in the second compartment 90, without exposure to air or other contaminants.

After moving laterally through the illustrated second compartment 90, the integrated circuit 70 is then moved upwardly into the third compartment 95. In this phase, the preferred precursor layer is formed on the cleaned conductive layer of the contact pad. As described above, the solution in the third compartment 95 comprises a conducting monomer to be later treated to form a conductive polymer. The monomer deposits on the conductive layer through hydrophilic interactions, while the protective layer over the surrounding insulating material prevents monomer deposition thereover.

The preferred monomer comprises pyrrole, having a density of less than about 0.99 g/cm$^3$. Accordingly, the pyrrole preferably floats above the preferred siliconizing agent in the underlying second compartment 90. As with the transfer from the first compartment 85 to the second compartment 90, the integrated circuit 70 need not pass through intermediate contaminating media, such as air, prior to forming the precursor layer.

Note that, in the illustrated embodiment, the phase in the third compartment 95 need not be immiscible with or of a different density than the phase in the first compartment 85, since the barrier 80 physically separates these phases. To ensure physical separation of the cleaning solution in the first compartment 85 from the monomer solution in the third compartment 95, the siliconizing agent in the lower compartment 90 preferably overfills the lower compartment 90 and extends into each of the upper compartments 85, 95, as illustrated.

As illustrated, the integrated circuit 70 is then raised out of the third compartment 95 into a fourth phase, where the precursor layer is treated to form the conductive passivation. As discussed above, the illustrated treatment comprises polymerization of the conducting monomer, and the preferred fourth phase comprises an ozone chamber. Desirably, heat treatment is also applied, which serves to evaporate the illustrated protective layer from over the surrounding insulating material.

Various modifications of the embodiment of FIG. 6 may be made without departing from the spirit of the invention. For example, the density of the phases can be reversed, such that the densities of the cleaning solution and the conducting monomer can be greater than the density of the solution forming the protective layer.

It will be understood that the integrated circuit 70 can pass through intermediate media prior to the polymerization or evaporation steps, if desired. Moreover, the integrated circuit may be passed through intermediate phases between the first and second or second and third phases, though such intermediate phases are preferably devoid of oxidizing or other contaminants. For example, an intermediate liquid phase can be added between the cleaning agent phase and the phase in which the protective layer is formed. Such an intermediate phase could perform additional cleaning of the conductive layer surface without exposing the same to air or other contaminants.

Though described in terms of certain preferred embodiments, the skilled artisan will readily appreciate that various modifications and alterations may be made to the described processes and structures, without departing from the scope and spirit of the invention. Accordingly, the invention is not meant to be limited to the embodiments disclosed herein, but should rather be defined by reference to the appended claims.

We claim:

1. A contact pad of an integrated circuit die, the contact pad adapted to provide electrical connection between the integrated circuit die and an electrical system, the contact pad comprising:
   a conductive layer; and
   a conductive passivation layer directly on the conductive layer,
   wherein the conductive passivation layer comprises a conductive polymer material,
   wherein the polymer material comprises polymerized pyrrole, acetylene, or aniline.

2. The contact pad of claim 1, wherein the conductive layer comprises aluminum.

3. The contact pad of claim 1, wherein the conductive layer comprises an aluminum alloy formed with copper, silicon, or both copper and silicon.

4. The contact pad of claim 1, wherein the conductive layer comprises an aluminum-copper alloy with about 0.5% copper content.

5. The contact pad of claim 1, wherein the conductive layer comprises a portion of a conductive line of the integrated circuit die.

6. The contact pad of claim 1, wherein the contact pad is integrally connected to a conductive line of the integrated circuit die, the conductive line comprising a metallic material.

7. The contact pad of claim 6, wherein the metallic material comprises aluminum, aluminum-silicon eutectic, or aluminum-copper alloy.

8. The contact pad of claim 1, wherein the contact pad comprises no intervening oxide material between the conductive layer and the conductive passivation layer.

9. A contact pad of an integrated circuit die, the contact pad adapted to provide electrical connection between the integrated circuit die and an electrical system, the contact pad comprising:
   a conductive layer; and
   a conductive passivation layer directly on the conductive layer,
   wherein the contact pad is integrally connected to a conductive line of the integrated circuit die, the conductive line comprising polysilicon,
   wherein the conductive passivation layer comprises a conductive polymer material,
   wherein the polymer material comprises polymerized pyrrole, acetylene, or aniline.

* * * * *